United States Patent [19]

Frentzel et al.

[11] Patent Number: 4,959,178

[45] Date of Patent: Sep. 25, 1990

[54] ACTINIC RADIATION-CURABLE CONDUCTIVE POLYMER THICK FILM COMPOSITIONS AND THEIR USE THEREOF

[75] Inventors: Richard L. Frentzel, Chino Hills; Noel C. Peralta, Glendora, both of Calif.

[73] Assignee: Advanced Products Inc., Cheshire, Conn.

[21] Appl. No.: 6,837

[22] Filed: Jan. 27, 1987

[51] Int. Cl.$^5$ .................... C09D 5/24; C08K 3/08; C08F 2/50

[52] U.S. Cl. .................... 252/514; 252/512; 427/54.1; 522/81; 522/116; 522/138; 523/512; 524/403; 524/530; 525/283

[58] Field of Search .............. 522/81, 116, 136, 138; 525/283; 524/440, 530, 403; 523/512, 513; 252/512, 514; 427/54.1

[56] References Cited

U.S. PATENT DOCUMENTS

| | | | |
|---|---|---|---|
| Re. 31,411 | 10/1983 | Bolon et al. | 252/501.1 |
| 3,968,056 | 7/1976 | Bolon et al. | 252/514 |
| 3,978,378 | 8/1976 | Tigner et al. | 317/258 |
| 3,989,644 | 11/1976 | Bolon et al. | 252/514 |
| 4,088,801 | 5/1978 | Bolon et al. | 427/54 |
| 4,233,191 | 11/1980 | Reuter et al. | 252/511 |
| 4,371,459 | 2/1983 | Nazarenko | 252/514 |
| 4,411,980 | 10/1983 | Haney et al. | 430/291 |
| 4,414,354 | 11/1983 | Slocombe | 522/116 |
| 4,425,263 | 1/1984 | Nazarenko | 252/511 |
| 4,460,427 | 7/1984 | Haney et al. | 156/303 |
| 4,532,021 | 7/1985 | Murphy | 522/116 |
| 4,592,961 | 6/1986 | Ehrreich | 428/480 |
| 4,595,604 | 6/1986 | Martin et al. | 427/96 |
| 4,595,605 | 6/1986 | Martin et al. | 427/96 |
| 4,604,230 | 8/1986 | Goswami | 252/514 |

FOREIGN PATENT DOCUMENTS

| | | |
|---|---|---|
| 5922969 | of 0000 | Japan . |
| 5981303 | of 0000 | Japan . |
| 6036578 | of 0000 | Japan . |
| 6055024 | of 0000 | Japan . |
| 2111072 | of 0000 | United Kingdom . |
| 832700 | 4/1960 | United Kingdom ................ 525/283 |

Primary Examiner—John C. Bleutge
Assistant Examiner—David Buttner
Attorney, Agent, or Firm—William A. Simons

[57] ABSTRACT

An actinic radiation curable polymer thick film composition comprising by weight:
(a) about 10 to about 20 parts of an unsaturated monomer capable of being polymerized by actinic radiation;
(b) about 2.5 to about 8 parts of at least one thermoplastic polymer having a glass transition value of above about 100° F. and not capable of being substantially cross-linked with monomer (a) and said polymer (b) is dissolved in monomer (a);
(c) about 68 to about 85 parts of conductive metal particles; and
(d) about 0.1 to about 5 parts of at least one actinic radiation polymerization initiator.

23 Claims, No Drawings

ACTINIC RADIATION-CURABLE CONDUCTIVE POLYMER THICK FILM COMPOSITIONS AND THEIR USE THEREOF

Background of the Invention

1. Field of the Invention

This invention relates to conductive polymer thick film (PTF) compositions which are UV curable and flexible, and to their method of use as electronic circuitry and the like. More particularly, this invention relates to conductive PTF compositions that exhibit good flexibility and UV curability and that can be bonded directly to a substrate.

2. Description of Prior Art

An electrically conductive PTF composition applied to a supporting or base structure (substrate) must be sufficiently conductive to carry electric current and must be firmly adhered or bonded to the support or base. Furthermore, it is desirable that the conductive PTF composition be UV curable and flexible while also having good abrasion resistance.

There is still a need for new UV curable PTF conductive compositions which have the combination of properties including the following: having acceptably low electrical resistivity; having acceptably good adhesion to a substrate; being sufficiently flexible to be applied to flexible substrates; and being easily prepared and inexpensively bonded to a substrate without a complicated procedure.

BRIEF SUMMARY OF THE INVENTION

The present invention, therefore, is directed to actinic radiation curable polymer thick film compositions comprising by weight:
(a) about 10 to about 20 parts of an unsaturated monomer capable of being polymerized by actinic radiation, preferably UV light in the wave length range of about 200–400 nanometers;
(b) about 2.5 to about 8 parts of at least one thermoplastic polymer being totally soluble in monomer (a) and having a glass transition value of above about 100° F. and not capable of being substantially cross-linked with monomer (a), preferably a vinylidene chloride copolymer or a polyester;
(c) about 68 to about 85 parts of conductive metal particles, preferably silver flakes; and
(d) about 0.1 to about 5 parts of at least one actinic radiation polymerization initiator.

Furthermore, the present invention is also directed to a method of preparing a polymer thick film on a substrate comprising the steps of:
(1) providing a polymer thick film composition comprising by weight:
(a) about 10 to about 20 parts of an unsaturated monomer capable of being polymerized by actinic radiation;
(b) about 2.5 to about 8 parts of at least one thermoplastic polymer being totally soluble in monomer (a) and having a glass transition value of above about 100° F. and not capable of being substantially cross-linked with monomer (a);
(c) about 68 to about 85 parts of conductive metal particles; and
(d) about 0.1 to about 5 parts of at least one actinic radiation polymerization initiator;
(2) applying said composition to a substrate, preferably flexible, and
(3) curing said composition on said substrate by exposing said mixture to a sufficient amount of actinic radiation.

Still further, the present invention is directed to cured polymer thick film compositions comprising by weight:
(a) about 10 to about 20 parts of a polymerized monomer;
(b) about 2.5 to about 8 parts of at least one thermoplastic polymer having a glass transition value of above about 100° F.;
(c) about 68 to about 85 parts of conductive metal particles;
wherein substantially no cross-linking occurs between (a) and (b).

And even further, the present invention is directed to a substrate, preferably flexible, having a cured conductive polymer thick film coating thereon which comprises by weight:
(a) about 10 to about 20 parts of a polymerized monomer;
(b) about 2.5 to about 8 parts of at least one thermoplastic polymer having a glass transition value of above about 100° F.;
(c) about 68 to about 85 parts of conductive metal particles;
wherein substantially no cross-linking occurs between (a) and (b).

DETAILED DESCRIPTION OF THE PREFERRED EMBODIMENT

As stated above, the present invention encompasses the combination in a polymer thick film of four different components: a monomer, a thermoplastic polymer, conductive metal particles and an actinic radiation polymerizable initiator. Any unsaturated monomer may be employed which is polymerizable by actinic radiation and will not substantially cross-link with the thermoplastic polymer used in the PTF composition. Such monomers should also be capable of dissolving the thermoplastic polymer in the uncured PTF composition. Mixtures of monomers may also be used. Mono-functional monomers (i.e. monomers with one unsaturated group) are preferred because they do not form cross-linked polymers with themselves (i.e. homopolymerize). N-vinyl-2-pyrrolidone is the preferred unsaturated monomer.

The amount of unsaturated monomer in the conductive PTF compositions should be from about 10 to about 20 parts by weight, preferably about 12 to 18 parts. Amounts above these levels may require an undesirable high level of actinic radiation to fully polymerize the unsaturated monomer. Amounts below these levels mean that the relative amount of thermoplastic polymer in the PTF composition is undesirably large so that the total formulation will be too viscous for effective screening or the like onto the substrate.

The thermoplastic polymers of this invention may be any saturated thermoplastic polymer which has a glass transition point of above about 100° F. The glass transition temperature ($T_G$) is the temperature at which an amphorous materials such as these polymers changes from a brittle, vitreous state to a plastic state. Preferably, the glass transition point is above about 110° F. One suitable type of thermoplastic polymers are the linear, high-tensile, aromatic polyester resins such as that sold under the trade designation VITEL PE-222 by Goodyear Tire and Rubber Company. This material is said by its supplier to have a glass transition point of 117° F./47° C.

Another suitable thermoplastic polymer is a vinylidene chloride copolymer sold by Dow Chemical under the trade designation SARAN F-310 (This particular copolymer also comprises acrylonitrile groups. This polymer has a glass transition point of 111° F./44° C. Mixtures of thermoplastic polymers may be used in this invention.

The desired amount of thermoplastic polymer in the conductive composition should be from about 2.5 to about 8 parts by weight, preferably about 3 to about 6 parts. The relative amounts of said monomer and said thermoplastic polymer should be such that sufficient monomer is present to totally solubilize or dissolve the polymer. As mentioned above, too much thermoplastic polymer may make the total PTF composition too thick for good application onto the substrate; however, amounts below this range may result in undesirably slow curing or no curing at all.

Having no substantial cross-linking between the polymerized monomer and the thermoplastic polymer in this PTF composition is a critical feature of this invention. This means that there are no reactive unsaturated groups in the thermoplastic polymer which might react with the monomer. It has been discovered that this absence of cross-linking improves the electrical conductivity of the composition (i.e. lowers resistivity) without adversely effecting the other desired properties of the composition.

Any conductive metal particle which does not adversely inhibit the curing of the monomer while providing the desired electrical conduction properties may be employed in the present PTF composition. Silver is the preferred conductive particle for most uses. Copper, gold, nickel or silver alloys may be more suitable for some uses. Carbon black or graphite are not generally suitable because they may interfere in the actinic radiation curing. Silver flake is the most preferred metal particle.

The average particle size of the metal particle is preferably from about 1 micron to about 50 microns, more preferably in the range from about 2 microns to about 20 microns. If the average particle size of the metal particles is less than about 1 micron, the electrical properties may be adversely effected. In other words, if the metal particles are too fine, the resistivity of the composition may be too high. If the average particle size of the metal particles is above about 50 microns, then the composition will be very difficult to apply to the substrate. For example, the composition will tend to clog up during a silk screening process or the like.

The amount of conductive metal particles in the conductive composition may range from about 68 to about 85 parts by weight, preferably about 70 to about 82 parts, of the total composition.

The actinic radiation polymerization initiators include conventional ultraviolet light and visible light initiators. The preferred ones are ultraviolet (UV) radiation photoinitiators or photosensitizers which are effective in Wavelengths from about 200 to about 400 nanometers. These may include ketones such as benzophenone, acetophenone, benzil, benzyl methyl ketone; benzoins and substituted benzoins such as benzoin methyl ether, α-hydroxymethyl benzoin isopropyl ether; sulfur compounds such as thiourea, aromatic disulfides and other photosensitizers such as azides, thioketones, or mixtures thereof. Also included are UV stabilizers such as hydroquinone, tert-butyl hydroquinone, 2,6-di-tert-butyl-p-cresol, benzotriazoles such as 2,4-hydroxybenzophenone, 2-hydroxy-4-methoxybenzophenone, and 4-dodecyl-2-hydroxybenzophenone.

The amount of polymerization initiator is preferably from about 0.1 to about 5 parts by weight, more preferably from about 0.5 to about 3 parts by weight, of the total conductive composition.

Other minor conventional components may be added to the conductive composition. These include diluents or viscosity modifying agents, defoamer surfactants, waxes and the like. The viscosity of the final conductive composition of the invention is preferably from about 8000 to about 25,000 centipoises at 30° C. (Brookfield RVT Spindle No. 6, 20 rpm) in order to be screen printable.

The components of the present invention may be mixed together by any conventional means. Preferably, it is desirable to mix the monomer and the polymer together in a conventional agitated mixing apparatus to dissolve the polymer in the monomer, followed by adding the metal particles to create a uniform mixture. This mixture may be then preferably placed in a 3 roll mill to obtain a fineness of grind of the composition of under about 20 microns. The photoinitiator or photoinitiators may then be added by conventional mixing means.

The compositions of this invention may be applied to substrates by a variety of techniques, such as silk screening, spraying or brushing. Once the conductive PTF composition has been applied to the substrate, it is dried and cured by exposing it and the substrate to UV light one or more times. UV exposure is preferred for at least about 2 seconds per pass; it should be noted that the total time of UV exposure will depend upon the apparatus employed. Any conventional UV curing apparatus may be used.

The conductive compositions of the present invention may be applied to conventional rigid or flexible substrates. Whether the substrate is flexible or rigid in nature, the substrate may or may not have to be pretreated or pre-coated with any other substance before applying the present compositions.

The conductive compositions of the present invention are flexible and as such they preferably may be applied to a flexible substrate such as, for example, membrane key boards. Examples of flexible substrates that can be coated with the conductive compositions of the present invention are polyimide substrates such as that made by E.I. Du Pont de Nemours Company and sold under the trademark Kapton ® and polyester substrates such as that made by E.I. Du Pont de Nemours Company and sold under the trademark Mylar ®. Of course, other flexible materials such as polycarbonate film or polyvinyl fluoride (PVF) film may be used as a flexible substrate.

The term "flexible" as presently employed in this specification and claims is used to mean when the compositions of the present invention may be subjected to deformative forces (e.g. twisting or bending) and will not release from the substrate or crack or break. The composition, in its deformed state, will function as well as the composition in its undeformed state. The most severe form of deformation would be to put a crease in the composition. This may be accomplished by a 180 degree angle fold of the composition and substrate. A flexible composition like those of the present invention will function well under this condition. If the composition cracks or breaks as the result of being distorted, the composition would not be considered flexible; cracks in the composition cause a severe decrease in conductivity and other electrical and mechanical properties.

The following Examples and Comparisons are shown to better illustrate the present invention. All parts and percentages are by weight unless otherwise explicitly stated.

EXAMPLE 1

A UV radiation curable dispersion was formed by first dissolving the polymer in N-vinyl-2-pyrrolidine using a propeller-agitated mixer and then adding silver flake. These three components were mixed in a three roll mill until a fineness of grind of 13 microns was obtained. After removing the ground dispersion from the three roll mill, the UV photoinitiator was mixed into the dispersion in a propeller-agitated mixer.

| Component | Parts By Weight |
| --- | --- |
| N-vinyl-2-pyrrolidone 1 | 16.50 |
| vinylidene chloride/acrylonitrile copolymer 2 | 4.06 |
| 1-hydroxycyclohexyl phenyl ketone/ benzophenone UV photoinitiator 3 | 0.48 |
| Silver Flake 4 | 78.96 |
| | 100.00 |

1 V-Pyrol sold by GAF Corporation of Wayne, New Jersey.
2 Saran F310 sold by Dow Chemical Company of Midland, Michigan.
3 Irgacure 500 sold by Ciba Geigy Corporation of Ardsley, New York.
4 Metz #51 sold by Metz Metallurgical Corporation of South Plainfield, New Jersey. This silver flake has an average particle size of 0.7–1.3 microns and a surface area of 2.5–3.5 $m^2$/gram.

After these mixing steps, the resulting dispersion was screen printed onto a poly(ethylene)terephthalate (PET) film ⑤ substrate by passing through a 330 mesh polyester screen. This printed substrate was then passed below a 300 watts per inch low pressure mercury vapor lamp, which irradiated it with a focused beam of ultraviolet light in the wavelength range of 200–400 nanometers. This UV light exposure caused the curing of the dispersion printed on the PET substrate. Table I below shows the surface resistivity characteristics of the cured dispersion after 3 passes underneath the lamp. For each pass, the speed at which the printed substrate was passed under the light was 10 feet per minute (or about 1 to 2 seconds of exposure to the UV light). Table II below shows the surface resistivity and flexibility characteristics of the cured dispersion after 8 passes underneath the lamp.

⑤ Du Pont 500 II Mylar film sold by E. I. Du Pont de Nemours and Company of Wilmington, Del.

The dried coating thickness for this Example and all of the following Examples and Comparison was 0.0003 to 0.0005 inches.

After three passes, the cured dispersion was a dry film and hard to the touch. Resistivity was measured using a digital voltmeter. The measured resistivity (milliohms per square at 1 mil thickness) between the ends of the coated PET strip of 8 milliohms is very low. As can be seen by comparing the results of E1 in Tables I and II, surface resistivity decreased only about 10% by having an additional 5 passes under the UV light to a total of 8 passes. Flexibility was determined by folding and creasing the printed substrate perpendicular to the conductor line and then measuring the change in surface resistivity. As can be seen, the percent increase in resistivity after creasing was very low (18%).

EXAMPLE 2

A dispersion was formed, printed on the same type of substrate and tested from the following components according to the procedure set forth in Example 1.

| Component | Parts By Weight |
| --- | --- |
| N-vinyl-2-pyrrolidone 1 | 16.50 |
| Thermoplastic polyester resin 6 | 4.06 |
| 1-hydroxycyclohexyl phenyl ketone/ benzophenone photoinitiator 3 | 0.48 |
| Silver Flake 4 | 78.96 |
| | 100.00 |

The test results are shown in Tables I and II below. Note that very low surface resistivities were obtained.

6 Vitel PE-222 sold by Goodyear Tire and Rubber Company of Akron, Ohio.

EXAMPLE 3

A dispersion was formed, printed on the same type of substrate and tested from the following components according to the procedure set forth in Example 1.

| Component | Parts By Weight |
| --- | --- |
| N-vinyl-2-pyrrolidone 1 | 18.13 |
| Thermoplastic polyester resin 6 | 5.13 |
| Acrylic Ketone Photoinitiator 7 | 2.74 |
| Silver Flake 4 | 74.00 |
| | 100.00 |

The test results are shown in Tables I and II below. Note that very low surface resistivities were obtained.

7 Dacocure 1664 sold by EM Industries Company of Hawthorne, New York.

COMPARISON 1

A dispersion was formed, printed on the same type of substrate and tested from the following components according to the procedure set forth in Example 1 except that a 200 watt/inch UV lamp and 4 passes instead of 3 passes were used.

| Component | Parts By Weight |
| --- | --- |
| N-vinyl-2-pyrrolidone 1 | 11.79 |
| Diacrylate ester of bisphenol A-type epoxy resin 8 | 5.05 |
| 1-hydroxycyclohexyl phenyl ketone/ benzophenone photoinitiator 3 | 0.51 |
| 2,5-dimethyl-2,5-bis (2-ethyl hexoyl peroxy) hexane initiator 9 | 0.67 |
| Silver Flake 4 | 81.98 |
| | 100.00 |

The test result is shown in Table I. Note that the measured surface resistivity is higher than the corresponding resistivites of Examples 1–3.

8 CELRAD 3600 sold by Celanese Corporation of New York, New York.
9 USP-245 sold by Witco Chemical Company of Richmond, California.

COMPARISON 2

A dispersion was formed, printed on the same type of substrate and tested from the following components according to the procedure set forth in Example 1 except that a 200 watt/inch UV lamp and 4 passes instead of 3 passes were used.

| Component | Parts By Weight |
|---|---|
| N-vinyl-2-pyrrolidone 1 | 16.39 |
| Acrylated urethane UV/EB curable resin 10 | 4.03 |
| 1-hydroxycyclohexyl phenyl ketone/ benzophenone photoinitiator 3 | 0.49 |
| 2,5-dimethyl-2,5-bis (2-ethyl hexoyl peroxy) hexane initiator 9 | 0.64 |
| Silver Flake 4 | 78.45 |
| | 100.00 |

The test result is shown in Table I. Note that the measured surface resistivity is higher than the corresponding resistivites of Examples 1–3.

10 CMD 6700 sold by Celanese Corporation of New York, New York.

COMPARISON 3

A dispersion was formed, printed on the same type of substrate and tested from the following components according to the procedure set forth in Example 1.

| Component | Parts By Weight |
|---|---|
| N-vinyl-2-pyrrolidone 1 | 20.56 |
| 1-hydroxycyclohexyl phenyl ketone/ benzophenone photoinitiator 3 | 0.48 |
| Silver Flake 4 | 78.96 |
| | 100.00 |

As shown in Tables I and II, the composition failed to cure after eight passes. Thus, this Comparison shows that the presence of a thermoplastic resin is required to attain a highly conductive, fully cured coating.

COMPARISON 4

A dispersion was formed, printed on the same type of substrate and tested from the following components according to the procedure set forth in Example 1.

| Component | Parts By Weight |
|---|---|
| 1,4-butanediol diacrylate 11 | 16.44 |
| vinylidene chloride/acrylonitrile copolymer 2 | 4.11 |
| 1-hydroxycyclohexyl phenyl ketone/ benzophenone photoinitiator 3 | 0.49 |
| Silver Flake 4 | 78.96 |
| | 100.00 |

11 Sartomer 213 Monomer sold by Arco Chemical Co. of Newton Square Pennsylvania.

As shown in Tables I and II, this composition failed to produce a coating exhibiting a surface resistivity as low as the compositions in Examples 1–3. This comparison appears to show that as the degree of cross-linking is increased in the coating, surface resistivity increases and flexibility and adhesion to the substrate decreases. As seen from Table II, the cured coating made with this composition was very inflexible as judged by the high increase in resistivity after creasing (838% increase).

COMPARISON 5

A dispersion was formed, printed on the same type of substrate and tested from the following components according to the procedure set forth in Example 1 except that a 200 watt/inch UV lamp and 4 passes instead of 3 passes were used.

| Component | Parts By Weight |
|---|---|
| Isobornyl acrylate 12 | 3.39 |
| Acrylated urethane UV/EB curable resin 10 | 7.64 |
| Acrylate functional oligomeric amine UV/EB curable resin 13 | 5.09 |
| 2-isopropylthioxanthone photoinitiator 14 | 0.76 |
| 2-(dimethylamino)ethyl benzoate photoinitiator 15 | 2.12 |
| 2,5-dimethyl-2,5-bis (2-ethyl hexoyl peroxy) hexane initiator 9 | 0.47 |
| sodium lauryl sulfate defoamer 16 | 0.95 |
| Silver Flake 17 | 79.98 |
| | 100.00 |

The test result is shown in Table I. Note that the measured surface resistivity is higher than the corresponding resistivites of Examples 1–3.

12 Monomer QM-589 sold by Rohm and Haas Company of Philadelphia, Pennsylvania.
13 CELRAD 7100 sold by Celanese Corporation of New York, New York.
14 Quantacure ITX sold by Aceto Chemical Company Inc. of Flushing, New York.
15 Quantacure DMB sold by Aceto Chemical Company Inc. of Flushing, New York.
16 Modaflow sold by Monsanto Chemical Company of St. Louis, Missouri.
17 Metz #26 sold by Metz Metallurgical Corporation of South Plainfield, New Jersey. This silver flake has an average particle size of 1.75–2.75 microns and a surface area of 0.25–0.75 $m^2$/gram.

The test result is shown in Table I. Note that the measured surface resistivity is higher than the corresponding resistivities of Example 1–3.

COMPARISON 6

A dispersion was formed, printed on the same type of substrate and tested from the following components according to the procedure set forth in Example 1 except that a 200 watt/inch UV lamp and 4 passes instead of 3 passes were used.

| Component | Parts By Weight |
|---|---|
| Isobornyl acrylate 12 | 0.84 |
| Trimethylolpropane triethoxy triacrylate 18 | 7.91 |
| Diacrylate ester of bisphenol A-type epoxy resin 8 | 7.91 |
| 2-isopropylthioxanthone photoinitiator 14 | 0.76 |
| 2-(dimethylamino)ethyl benzoate photoinitiator 15 | 2.12 |
| 2,5-dimethyl-2,5-bis (2-ethyl hexoyl peroxy) hexane initiator 9 | 0.48 |
| Silver Flake 17 | 79.98 |
| | 100.00 |

The test result is shown in Table I. Note that the measured surface resistivity is higher than the corresponding resistivites of Examples 1–3.

18 Al.Co.CURE ™ TMPTETA sold by Alcolac Chemical Company of Baltimore, Maryland.

The test result is shown in Table I. Note that the measured surface resistivity is higher than the corresponding resistivities of Examples 1–3.

COMPARISON 7

A dispersion was formed, printed on the same type of substrate and tested from the following components according to the procedure set forth in Example 1 except that a 200 watt/inch UV lamp and 4 passes instead of 3 passes were used.

| Component | Parts By Weight |
|---|---|
| Isobornyl acrylate 12 | 0.84 |
| Trimethylolpropane triethoxy triacrylate 18 | 7.91 |
| Acrylated urethane UV/EB curable resin 10 | 7.91 |
| 2-isopropylthioxanthone photoinitiator 14 | 0.76 |
| 2-(dimethylamino)ethyl benzoate photoinitiator 15 | 2.12 |
| 2,5-dimethyl-2,5-bis (2-ethyl hexoyl peroxy) hexane initiator 9 | 0.48 |
| Silver Flake 17 | 79.98 |
| | 100.00 |

The test result is shown in Table I. Note that the measured surface resistivity is higher than the corresponding resistivities of Examples 1-3.

COMPARISON 8

A dispersion was formed, printed on the same type of substrate and tested from the following components according to the procedure set forth in Example 1 except that a 200 watt/inch UV lamp and 4 passes instead of 3 passes were used.

| Component | Parts By Weight |
|---|---|
| Isobornyl acrylate 12 | 0.84 |
| Trimethylolpropane triethoxy triacrylate 18 | 7.91 |
| Acrylate functional oligomeric amine UV/EB curable resin 13 | 7.91 |
| 2-isopropylthioxanthone photoinitiator 14 | 0.76 |
| 2-(dimethylamino)ethyl benzoate photoinitiator 15 | 2.12 |
| 2,5-dimethyl-2,5-bis (2-ethyl hexoyl peroxy) hexane initiator 9 | 0.48 |
| Silver Flake 17 | 79.98 |
| | 100.00 |

The test result is shown in Table I. Note that the measured surface resistivity is higher than the corresponding resistivities of Examples 1-3.

COMPARISON 9

A dispersion was formed, printed on the same type of substrate and tested from the following components according to the procedure set forth in Example 1 except that a 200 watt/inch UV lamp and 4 passes instead of 3 passes were used.

| Component | Parts By Weight |
|---|---|
| Isobornyl acrylate 12 | 3.39 |
| Acrylated urethane UV/EB curable resin 10 | 7.64 |
| Acrylate functional oligomeric amine UV/EB curable resin 13 | 5.09 |
| 2-isopropylthioxanthone photoinitiator 14 | 0.76 |
| 2-(dimethylamino)ethyl benzoate photoinitiator 15 | 2.12 |
| 2,5-dimethyl-2,5-bis (2-ethyl hexoyl peroxy) hexane initiator 9 | 0.47 |
| Sodium lauryl sulfate defoamer 16 | 0.55 |
| Silver Flake 4 | 79.98 |
| | 100.00 |

The test result is shown in Table I. Note that the measured surface resistivity is higher than the corresponding resistivities of Examples 1-3.

COMPARISON 10

A dispersion was formed, printed on the same type of substrate and tested from the following components according to the procedure set forth in Example 1 except that a 200 watt/inch UV lamp and 4 passes instead of 3 passes were used.

| Component | Parts By Weight |
|---|---|
| Trimethylolpropane triethoxy triacrylate 18 | 16.39 |
| Acrylated urethane UV/EB curable resin 10 | 4.03 |
| 1-hydroxycyclohexyl phenyl ketone/ benzophenone photoinitiator 3 | 0.49 |
| 2,5-dimethyl-2,5-bis (2-ethyl hexoyl peroxy) hexane initiator 9 | 0.64 |
| Silver Flake 4 | 78.45 |
| | 100.00 |

The test result is shown in Table I. Note that the measured surface resistivity is higher than the corresponding resistivities of Examples 1-3.

COMPARISON 11

A dispersion was formed, printed on the same type of substrate and tested from the following components according to the procedure set forth in Example 1 except that a 200 mesh polyester screen was used because the dispersion was too thick to pass through the 330 mesh screen.

| Component | Parts By Weight |
|---|---|
| Isobornyl acrylate 12 | 4.82 |
| Acrylated urethane UV/EB curable resin 10 | 10.86 |
| Acrylate functional oligomeric amine UV/EB curable resin 13 | 7.24 |
| 2-isopropylthioxanthone photoinitiator 14 | 1.08 |
| 2-(dimethylamino)ethyl benzoate photoinitiator 15 | 3.00 |
| sodium lauryl sulfate defoamer 16 | 0.78 |
| Silver Flake 4 | 72.22 |
| | 100.00 |

The test results are shown in Tables I and II. Note that the measured surface resistivity is higher than the corresponding resistivities of Examples 1-3. This composition is very similar to the composition disclosed in UK Patent No. 2111072A. Flexibility was also poor as judged by the increase in resistivity after creasing (184% increase).

TABLE I

Surface Resistivity Measurements After 3 or 4 Passes Under UV Lamp

| Example or Comparison | Watts of UV Lamp | Passes | Resistivity Milliohms per square at 1 mil thickness |
|---|---|---|---|
| E-1 | 300 | 3 | 8.0 |
| E-2 | 300 | 3 | 13.1 |
| E-3 | 300 | 3 | 14.7 |
| C-1 | 200 | 4 | 22.4 |
| C-2 | 200 | 4 | soft (N.M.) |
| C-3 | 300 | 3 | wet, not cured (N.M.) |
| C-4 | 300 | 3 | 26.5 |

TABLE I-continued

Surface Resistivity Measurements
After 3 or 4 Passes Under UV Lamp

| Example or Comparison | Watts of UV Lamp | Passes | Resistivity Milliohms per square at 1 mil thickness |
|---|---|---|---|
| C-5 | 200 | 4 | 47.3 |
| C-6 | 200 | 4 | 232.0 |
| C-7 | 200 | 4 | 176.0 |
| C-8 | 200 | 4 | 122.0 |
| C-9 | 200 | 4 | 42.5 |
| C-10 | 200 | 4 | 324.0 |
| C-11 | 300 | 3 | 81.0 |

(N.M.) = not measurable

TABLE II

Surface Resistivity and Flexibility Measurements
After 8 Passes Under UV Lamp

| Example or Comparison | Resistivity Milliohms per square at 1 mil Thickness Before 180° Fold | % Increase In Surface Resistivity after 180° Fold |
|---|---|---|
| E-1 | 7.0 | 18.6 |
| E-2 | 11.5 | 110 |
| C-3 | Wet, not cured (N.M.) | (N.M.) |
| C-4 | 22.6 | 838 |
| C-11 | 70.3 | 184 |

(N.M.) = not measurable

What is claimed is:

1. An actinic radiation curable polymer thick film composition comprising by weight:
   (a) about 10 to about 20 parts of at least one monofunctional unsaturated monomer capable of being polymerized by actinic radiation;
   (b) about 2.5 to about 8 parts of at least one thermoplastic polymer having a glass transition value of above about 100° F. and not capable of being substantially cross-linked with polymerized monomer (a) and said polymer (b) is dissolved in monomer (a);
   (c) about 68 to about 85 parts of conductive metal particles; and
   (d) about 0.1 to about 5 parts of at least one actinic radiation polymerization initiator.

2. The composition of claim 1 wherein said monomer (a) is N-vinyl-2-pyrrolidone.

3. The composition of claim 1 wherein said thermoplastic polymer (b) is a polyvinylidene chloride lacrylonitrile copolymer.

4. The composition of claim 1 wherein said thermoplastic polymer (b) is a polyester polymer.

5. The composition of claim 1 wherein said metal particles (c) are silver flakes.

6. The composition of claim 1 wherein said polymerization initiator (d) is a UV photoinitiator.

7. The composition of claim 1 wherein
   (a) is present in about 12 to about 18 parts;
   (b) is present in about 3 to about 6 parts;
   (c) is present in about 70 to about 82 parts; and
   (d) is present in about 0.3 to about 2 parts.

8. An actinic radiation curable composition comprising by weight:
   (a) about 12 to about 18 parts of N-vinyl-2-pyrrolidone;
   (b) about 3 to about 6 parts of at least one thermoplastic polymer having a glass transition value of above about 100° F. and not capable of substantially cross-linking with polymerized N-vinyl-2-pyrrolidone and said polymer (b) is dissolved in N-vinyl-2-pyrrolidone
   (c) about 70 to about 82 parts of silver particles; and
   (d) about 0.3 to about 2 parts of a UV photoinitiator.

9. The composition of claim 8 wherein said thermoplastic polymer (b) is a polyvinylidene chloride lacrylonitrile copolymer.

10. The composition of claim 8 wherein said thermoplastic polymer (b) is a polyester polymer.

11. A method of preparing a polymer thick film on a substrate comprising the steps of:
    (1) providing a polymer thick film composition comprising:
       (a) about 10 to about 20 parts of at least one monofunctional unsaturated monomer capable of being polymerized by actinic radiation;
       (b) about 2.5 to about 8 parts of at least one thermoplastic polymer having a glass transition value of above about 100° F. and not capable of being substantially cross-linked with polymerized monomer (a) and said polymer (b) is dissolved in monomer (a);
       (c) about 68 to about 85 parts of conductive metal particles; and
       (d) about 0.1 to about 5 parts of at least one actinic radiation polymerization initiator.
    (2) applying said composition to a substrate, and
    (3) curing said composition onto said substrate by exposing said mixture to a sufficient amount of actinic radiation.

12. The method of claim 11 wherein said applying step (2) comprises a screening operation.

13. The method of claim 11 wherein said actinic radiation is UV light energy.

14. The method of claim 11 wherein said substrate is rigid.

15. The method of claim 11 wherein said substrate is flexible.

16. A cured polymer thick film composition consisting essentially of by weight:
    (a) about 10 to about 20 parts of at least one polymerized mono-functional monomer, said monomer polymerized by means of actinic radiation;
    (b) about 2.5 to about 8 parts of at least one thermoplastic polymer having a glass transition value of about 100° F.;
    (c) about 68 to about 85 parts of conductive metal particles; and
    wherein substantially no cross-linking occurs between (a) and (b).

17. The cured composition of claim 16 wherein said monomer (a) is N-vinyl-2-pyrrolidone.

18. The cured composition of claim 16 wherein said thermoplastic polymer (b) is a polyvinylidene chloride lacrylonitrile copolymer.

19. The cured composition of claim 16 wherein said thermoplastic polymer (b) is a polyester polymer.

20. The cured composition of claim 16 wherein said metal particles (c) are silver flakes.

21. The cured composition of claim 16 wherein
    (a) is present in about 12 to about 18 parts;
    (b) is present in about 3 to about 6 parts;
    (c) is present in about 70 to about 82 parts.

22. A substrate having a conductive polymer thick film coating thereon which consists essentially of by weight:

(a) about 10 to about 20 parts of a polymerized monofunctional monomer, said monomer polymerized by means of actinic radiation;
(b) about 2.5 to about 8 parts of at least one thermoplastic polymer having a glass transition value of above about 100° F.;
(c) about 68 to about 85 parts of conductive metal particles; and wherein substantially no cross-linking occurs between (a) and (b).

23. The coated substrate of claim 22 wherein said substrate is flexible.

* * * * *